United States Patent [19]
Scheidecker et al.

[11] Patent Number: 5,734,523
[45] Date of Patent: Mar. 31, 1998

[54] CONDUCTIVE FILM CONNECTORS FOR USE ON HEAD ASSEMBLIES IN DRIVES

[75] Inventors: Ralph W. Scheidecker, Clarksville, Iowa; William W. Brooks, Rochester, Minn.

[73] Assignee: Pemstar, Inc., Rochester, Minn.

[21] Appl. No.: 690,311

[22] Filed: Jul. 24, 1996

[51] Int. Cl.$^6$ .................... G11B 5/60; G11B 21/21
[52] U.S. Cl. ............................................. 360/103
[58] Field of Search ................................ 360/103, 104

[56] References Cited

U.S. PATENT DOCUMENTS 5,362,421 11/1994 Kropp et al. .................. 252/512

OTHER PUBLICATIONS

3M, Tech Tip, Rework and Cleaning Procedure, 3M™Heat Seal Connector C1 Series, 1995.
3M, 3M HSC C1 Series Cross Section
3M, 3M™Heat seal Connector C1 Series Data Sheet, Sep. 2, 1995.
3M, 3M™ Heat Seal Connector AS2 Series Data Sheet–Preliminary, May 14, 1996.
3M, Preliminary 3M Flexible Circuit DCA Interconnect System, Sep. 1996.
3M, 3M Heat Seal Connectors.
3M, 3M Flexible Circuit, 1996.
3M, 3M™ Heat Seal Connector Design Guidelines, pp. 1–18, Jun. 3, 1996.
3M, 3M Tech Paper, Options for Adhesively Bonded Display Driver Interconnect, 1995.
3M, 3M Tech Paper—Flexible Circuit, Conductive Adhesives and Their Applications, 1995.
3M, 3M Tech Paper—Adhesive–Based Interconnection System Provides Low–Cost, High Performance Packaging Solution, 1996.
3M, 3M™ Heat Seal Connector Cross Section, 1996.
3M, Take advantage of 3M's new, easy–to–use on–line services.
3M, M™ Heat Seal Connectors—Faster prototyping, superior support and greater design flexibilty.

*Primary Examiner*—Robert S. Tupper
*Attorney, Agent, or Firm*—Dorsey & Whitney LLP

[57] ABSTRACT

The present invention relates to a head gimbal assembly comprising a slider and a connector cable. The connector cable is attached to the slider using a Z-axis adhesive, whereby electricity is conducted through the adhesive film thickness but not within the plane of the adhesive.

4 Claims, 8 Drawing Sheets

CONDUCTIVE FILM CONNECTORS FOR USE ON HEAD ASSEMBLIES IN DRIVES

FIELD OF THE INVENTION

The present invention relates to a method for constructing a Head Gimbal Assembly and a Head Stack Assembly. In particular, the present invention relates to the use of a Z-axis adhesive to attach a connector cable to a magnetic head assembly and an actuator flex cable.

BACKGROUND OF INVENTION

The Head Gimbal Assembly ("HGA") is an assembly consisting of a magnetic head assembly or slider, a suspension assembly, and some type of wire connections head assembly which provides an electrical path to and from the slider. This HGA is also sometimes referred to as a Head Suspension Assembly ("HSA"), or as a hard file head. (The "gimbal" referred to in the name describes the gimballing action that a small part of the suspension, the flexure, provides to the slider.)

The slider is a rectangular block of some durable material, with some rails or other raised details that create an air bearing between the slider and the magnetic disk surface when the slider is moved at high relative velocity over a disk. The slider also has some electromagnetic structure on or near the rear surface of the slider body. This electromagnetic structure performs the writing and reading of magnetic information to and from the disk. The slider material can be a tough non-magnetic material such as the tungsten carbide used in most inductive sliders and MR[1] thin film sliders[2], or the less durable, but magnetic, ferrites used in all of the older ferrite coil-wound magnetic sliders.

[1] MR is an acronym which stands for magneto-resistive, the effect exploited to read very faint magnetic records from disks (and tapes). The MR element changes resistance in response to the static magnetic field that it is immersed in. This resistance change can be measured by measuring the voltage change if a constant current source is supplied to the element or by measuring current changes if a constant voltage source is used.
[2] The magnetic element is created through the use of a thin film structure hence the name 'thin film'.

A lead assembly is a collection of electrical leads and mechanical components used to connect the read/write elements of the slider with the actuator flex cable on a hard drive actuator. The oldest style lead assembly consisted of two or more small diameter (eg. 0.0013 inches diameter) insulated wires twisted together (for electrical noise rejection), with stripped ends for soldering or ultrasonic welding, all inside of a small diameter Teflon™ tube, which served to mechanically protect the wires from damage during the HGA and actuator assembly processes.

Generally, in manufacturing an HGA, fine wires are used to connect the read/write elements of the slider to the actuator flex cable on a drive actuator. These fine wires are very fragile and because of this, conventional manufacturing approaches to making the HGA for hard files have used manual assembly. The loose wires on the actuator end of the HGA also need manual assembly to connect these leads to the actuator flex cable. All of this wire routing, connection and tacking or crimping is very labor intensive, consuming more than half of the labor needed to assemble a drive, so alternatives are very desirable to reduce the cost of the drive.

The lead connection system has been automated via an automated wire stringing process, but this process requires a high capital investment. With the patented wire stringing process, the lead assembly is simply a twisted pair of wires which is robotically placed against the suspension, and permanently fastened in place with tacking dots of ultraviolet light curable adhesive.

In addition to these two methods being labor or capital intensive, thus, expensive, these two methods do not provide a convenient method for draining static charge.

Electro-Static Discharge ("ESD"), which is the rapid flow of static electricity to an uncharged body, can be very damaging to fine (i.e. small cross-section) leads in various electronic components, including the MR element of an MR slider. As the storage density in a disk goes up, the MR element must be reduced in width and thickness, which makes it increasingly vulnerable to ESD damage. For example, on current MR products, the discharge of the amount of charge that can be carried by the average human body at a potential of 100 volts (very low for static charges) is more than enough to destroy the MR element. The slider must be grounded to provide a drain for the electro-static-discharge. Currently, it is very difficult to do this grounding operation, because the most straightforward way of doing it would require using a conductive adhesive such as silver-loaded epoxy, and such adhesives shed too much debris to be used within the ultraclean hard file enclosure. Thus, a method for assembling HGA's which allows for the draining of static charge is needed.

A Head Stack Assembly comprises a plurality of HGAs placed in a comb, with the connector cables from each HGA attached to an actuator flex cable. This process of attaching each wire from each of the HGAs is very labor intensive. A Head Stack Assembly, therefore, has all the assembly issues associated with HGAs and additional issues raised by the connector cable attachment. Thus, a method which would allow these connector cables to be attached more easily is desirable.

SUMMARY OF THE INVENTION

The present invention provides an efficient and economical method for attaching connectors to magnetic head assemblies to manufacture a variety of products such as hard disk drives, floppy disk drives, tape drives, and to manufacture optical head assemblies to make CD ROM drives. In accordance with the present invention, a slider and connector cable are attached using a Z-axis adhesive. The slider comprises at least one electrical connection pad. The connector cable comprises a plastic film carrying one or more conductive leads with an overcoat of a Z-axis adhesive. A Z-axis adhesive comprises conductive particles dilutely mixed in a thermoplastic or thermosetting adhesive film. The Z-axis adhesive is used to attach the connector cable to the slider at the at least one electrical connection pad. By using the Z-axis adhesive to attach the connector cable to the slider, there is electrical conduction between the connector cable and the slider through the adhesive film thickness but not substantially within the plane of the adhesive.

Once the connector and the slider have been attached, this assembly is connected to a suspension, thereby forming a head gimbal assembly which is used in the manufacture of various drives. A plurality of these head gimbal assemblies are connected together by a comb. A Z-axis adhesive is then used to attach each of the connector cables extending from each Head Gimbal Assembly to a flex actuator cable, thereby forming a head stack assembly.

An object of the present invention is to provide an economical method for attaching a connector to a slider and for attaching a connector to an actuator cable.

Another object of the present invention is to provide drainage of static discharge from HGAs when necessary.

A further object of the present invention is to provide a method to simplify the steps necessary to attach a connector to a slider and an actuator cable.

DETAILED DESCRIPTION OF THE PRESENT INVENTION

Figure 1:
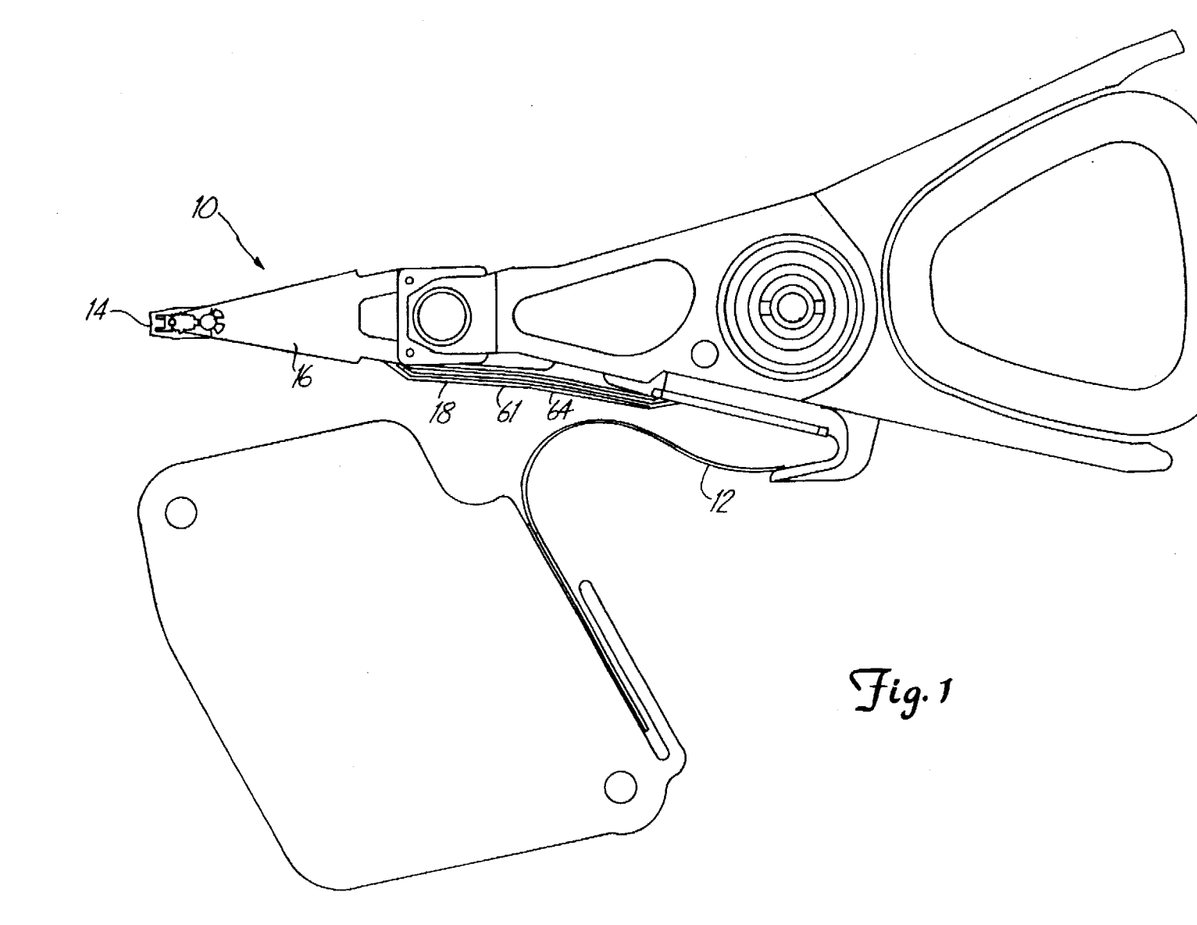
FIG. 1 shows a Head Gimbal Assembly connected to a flex actuator cable.

FIG. 1 shows a Head Gimbal Assembly ("HGA") 10 mounted in a comb or E-block 11 attached to an actuator flex cable 12. The HGA 10 comprises a slider 14, a suspension 16, and a connector cable 18. The connector cable 18 comprises a flexible substrate 61, such as a plastic film, with a plurality of conductive lines or conductive leads 64. The connector cable 18 is attached to the slider 14 and to the actuator flex cable 12. The connector cable 18 provides electrical connection between the slider 14 and the flex actuator cable 12 through the leads 64. The present invention provides an efficient and economical method for attaching connector cables 18 to magnetic head assemblies or sliders 14 to manufacture a variety of products such as hard disk drives, floppy disk drives, tape drives, and optical head assemblies to make CD ROM drives (see FIG. 1 where the actuator flex cable 12 which is attached to the HGA 10 is connected to a hard file connector 13 for manufacturing a hard disk drive). In particular, as will be described in greater detail, a Z-axis adhesive is used to attach the connector cable 18 to the slider 14 and the actuator flex cable 12. This attachment allows electricity to be conducted through the thickness of the Z-axis adhesive and not within the plane of the Z-axis adhesive.

As will be described later, a Head Stack Assembly which comprises a plurality of HGAs 10 is formed by attaching each of the connector cables 18 of each of the HGAs 10 to an actuator flex cable 12. The Z-axis adhesive is used to attach each of the leads 64 in connector cables 18 from each of the HGAs 10 to a corresponding connector pad on the flex actuator cable 12. This use of the Z-axis adhesive reduces the labor intensive operation of carefully attaching each lead connector cable 18 to the appropriate connector pad on the actuator flex cable 12.

FIGS. 2a–2c and 3 show a top, side, and plan view of a slider 14. As described previously, a slider 14 is a rectangular block of some durable material, with some rails or other raised details that create an air bearing between the slider 14 and magnetic disk when the slider 14 is moved at a high relative velocity over a disk. The slider 14 has some electromagnetic structure on or near the rear surface of the slider body, which performs the writing and reading of magnetic information to and from the disk. The slider material can be a tough non-magnetic material such as the tungsten carbide, which is used in most inductive sliders and magneto resistive ("MR") thin film sliders, or the less durable, but magnetic, ferrites, which is used in all of the older ferrite coil-wound magnetic sliders.

Figure 2A:
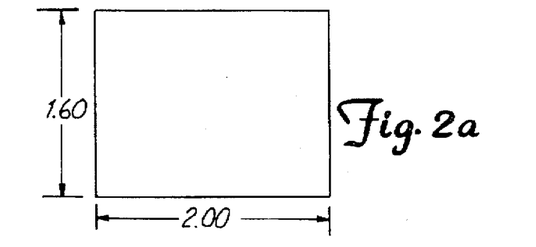
FIGS. 2a–c show a top, side, and plan views of a slider.
Figure 2B:
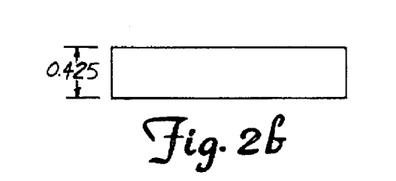
Figure 2C:
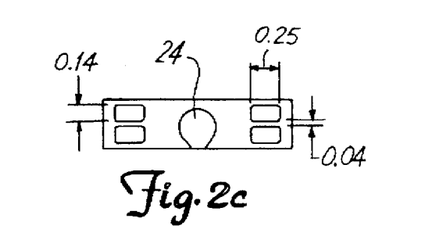
Figure 3:
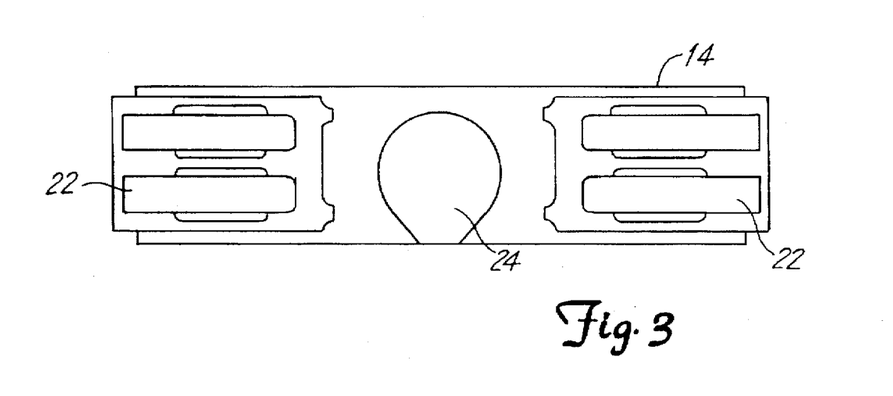
FIG. 3 shows a plan view of a slider with additional detail for the connection pads.

Typical size and details of an MR 50% (or 'nano') slider 14 are shown in FIGS. 2a–2c. As can be seen, the 50% slider is 1.6 by 2.0 by 0.425 mm in size. The slider 14 has a suspension bonding surface 68 (see FIG. 10) where the suspension 16 will be attached to the slider 14. Furthermore, as shown in FIGS. 2a–2c and 3, the rear of the slider 14 has electrical connection pads 22 and a read/write sensor 24. As will be described in detail the flex connector cable 18 is attached to the slider 14 at the electrical connection pads 22, and the read/write sensor 24 is used to retrieve and manipulate data on the storage device (e.g., disk drive magnetic surface). Although FIGS. 2a–2c and 3 show four connection pads 22, the number of connection pads 22 may be varied. Furthermore, while "nano" sliders are currently being used, the present invention may also be practiced with pico-sliders which are smaller than the nano sliders.

Manufacturing Process for Assembling an HGA

A. General Overview

Figure 4:
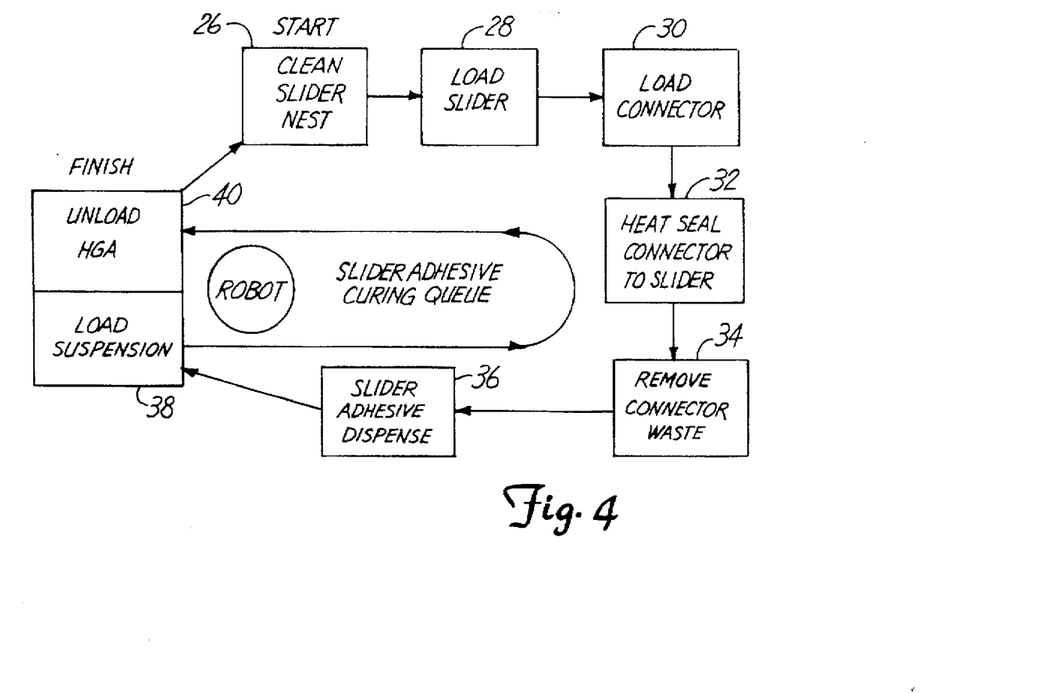
FIG. 4 is a diagram illustrating the steps for manufacturing a Head Gimbal Assembly.

With reference to FIGS. 4–11, the manufacturing process for constructing an HGA 10 using the present invention will be described. FIG. 4 shows a block diagram of an HGA manufacturing process using the present invention. The basic idea of the assembly method illustrated in FIG. 4 is that the parts circulate around an assembly line on precisely made tool blocks 42 (see FIG. 5). The HGA geometrical tolerances are provided by the locating features of the tool blocks, and the tool blocks also serve as a robust carrier for moving and positioning of the HGA 10 in the various work stations. All of the stations would be mechanically connected via a conveyor system. All stations would operate asynchronously, independently of each other, for maximum throughput and minimal control complexity.

Figure 5:
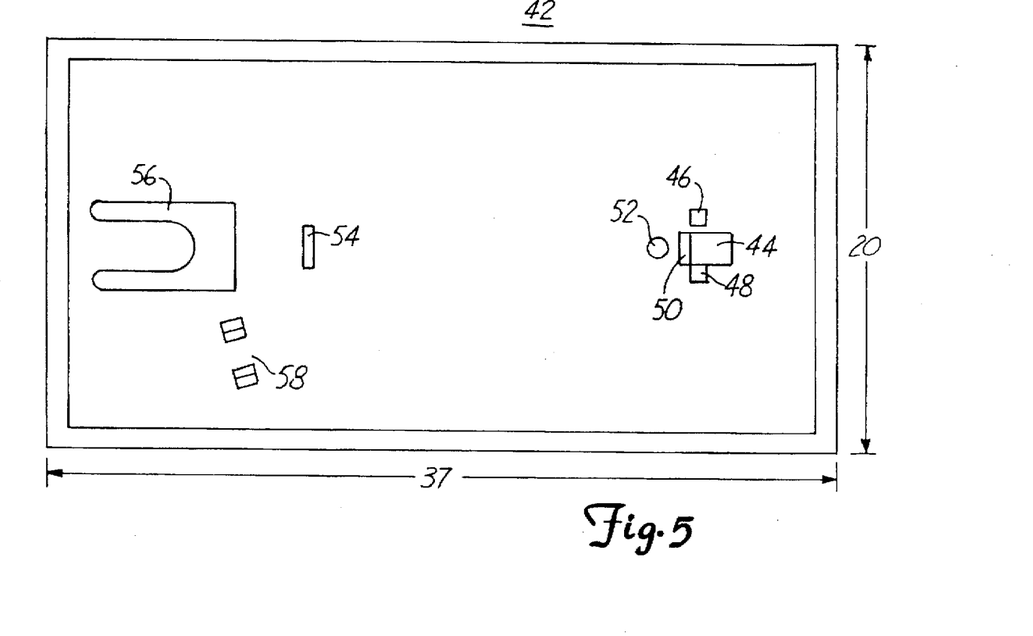
FIG. 5 shows a perspective view of a tool block used to assemble a connector and a slider.

Before describing the manufacturing process, with reference to FIG. 5, a tool block 42 used to assemble a HGA 10 will be described. As shown in FIG. 5, the tool block 42 comprises a slider nest 44 having a slider side clamp 46 (shown in the open position in FIG. 5), slider side datum pin 48, and a slider front datum rail 50, a suspension connector datum pin 52, a suspension pull-back pin 54, a mount block hold down clamp 56, and a connector alignment slot 58.

A slider nest 44 is a mechanical structure used to hold the slider 14 and suspension 16 in a very precise location with respect to an assembly fixture (or tool block). By holding the suspension 16 very precisely with respect to the slider 14, the two parts can be attached to one another with very tight geometric tolerances. Such tight geometric tolerances are needed to provide an acceptable fly-height distribution for the HGAs 10 when used within the hard drives.

The tool block 42 has dimensions of approximately 20 millimeters ("mm") by 37 mm. The assembly operations for manufacturing a HGA 10 are performed in the tool block 42. With reference to FIGS. 4 and 6–11, these operations will now be described.

Referring to FIG. 4, the first step 26 is to clean the slider nest 44. This cleaning step 26 will remove any debris that has been left behind as the HGA 10 that was previously assembled on the tool block 42 was removed.

Next, continuing to refer to FIG. 4, the second step 28 is to remove the slider 14 from its shipping tray, tube or tape, and to place it into the nest 44. The slider 14 is held in place by the slider side clamp 46, the slider side datum pin 48, and the slider front datum rail 50. The slider side clamp 46 must be held open while the slider 14 is being placed into the nest 44. Once the slider 14 is in position and is held toward the front part of the nest 44 (the slider front datum rail 50), the slider side clamp 46 is released and clamps the slider 14 firmly in place against the slider side datum pin 48. Once the side clamp 46 is released, the pusher detail (which is part of the station and is not shown in FIG. 5) can be retracted, and the tool block 42 released to move to the next station.

Figure 6:
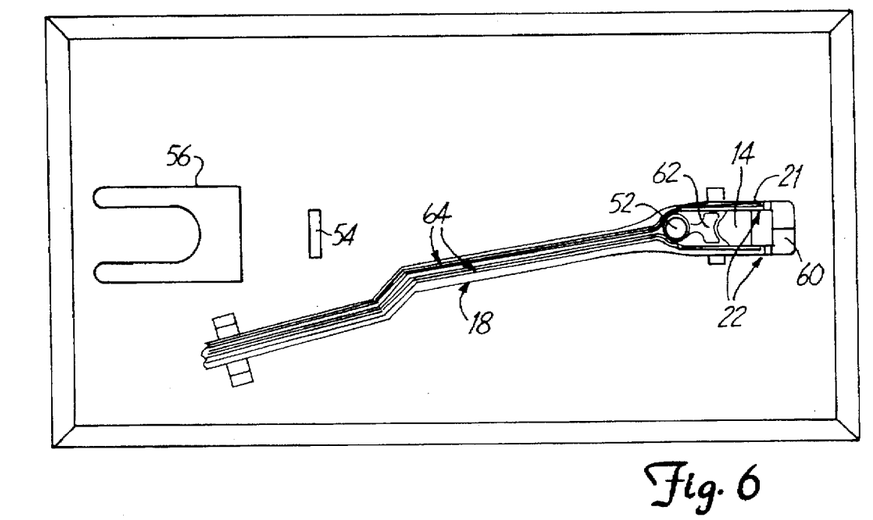
FIG. 6 shows a connector and a slider placed in a tool block.

Referring to FIG. 4, once the slider nest 44 (see FIG. 5) is cleaned 26 and the slider 14 is loaded 28 into the nest 44, the third step 30 is to trim the connector cable 18 free from the reel of connector parts (i.e., to 'singulate' the connector), then to place it over the locating features of the tool block 42. To perform this step, an automated station is used to cut an individual connector cable 18 free from the continuous strip of connector cables 18. This strip 18 comes in from the connector cable manufacturer on a reel, and standard dereeling equipment is used to bring the connector strip 18 into this station. After the dereeler has advanced the strip by one connector cable 18, a vacuum end effector grasps the connector cable 18, and then a die clips the connector cable 18 free from the strip. As soon as a tool block 42 containing a slider 14 arrives, the end effector places the connector cable 18 down over the slider 14 and onto the tool block locating pins 58, namely the suspension/connector datum pin 52 and the connector alignment slot 58 to capture the connector tail 19 (as shown in FIG. 6). This step is not a challenging operation to perform, and the station could be built cheaply and could run as fast as any of the other stations on the line. (Note that all but the place operation can be performed while the tool blocks are in transit from station to station or from pre-stop to station.)

Figure 8:
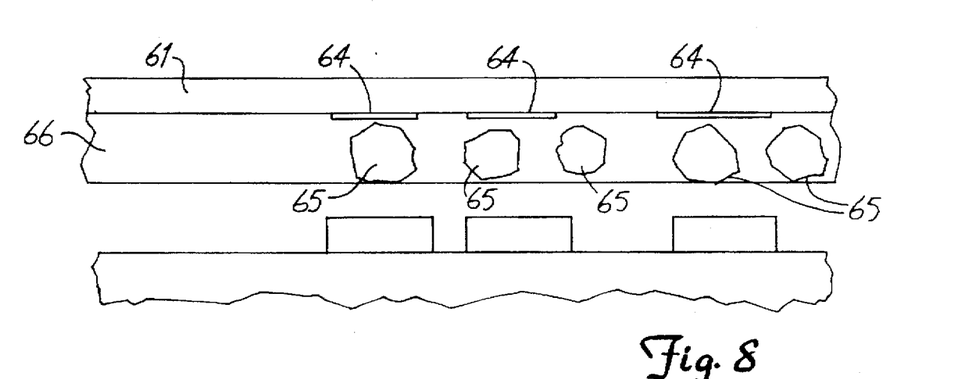
FIG. 8 shows a Z-axis connection before bonding.
Figure 9:
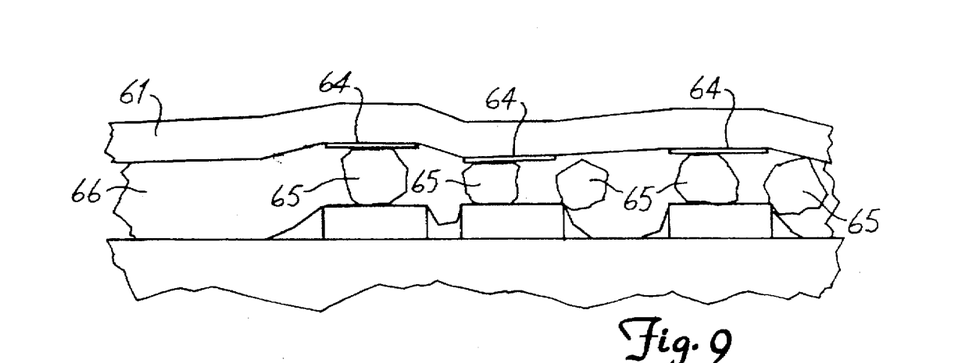
FIG. 9 shows a Z-axis connection after bonding.

For the present invention, the connector cable 18 is the lead assembly which connects the read/write elements of the slider 14 with the flex actuator cable 12. The connector cable 18 used in the present invention is a special type of flex cable using anisotropic conductive film to perform the electrical and mechanical connection of the lead assembly to the slider. As shown in FIGS. 6, 8 and 9, the connector cable 18 comprises a flexible substrate 61, such as a plastic film carrying one or more conductive leads 64. The connector cable 18 has a first end 21 and a second end 23. The first end 21 of the connector cable 18 is attached to a slider 14. The second end 23 of the connector cable 18 is attached to an actuator flex cable 12. Also, the connector cable 18 has an overcoat of a Z-axis adhesive layer 66, which may be a thermoplastic or thermosetting adhesive film layer containing conductive particles 65, over the flexible substrate 61. Thus, with respect to the first end 21 of the connector cable 18, the electrical connection occurs between the connection pads 22 of a slider 14, the conductive particles 65 in the Z-axis adhesive 66 and the flex cable leads 64 at the first end of the connector cable 18. With respect to the second end 23 of the connector cable 18, the electrical connection occurs between the connection pads of an actuator flex cable 12, the conductive particles 65 of the Z-axis adhesive, and the flex cable leads 64 at the second end of the connector cable 18. This type of adhesive is sold by 3M. The design of the leads 64 in a particular connection cable 18 depends on the application for which the connection cable will be used. Thus, the number of leads and the application for particular leads will be determined based on the needs of a particular application.

B. The Z-Axis Adhesive

The Z-axis adhesive used in the present invention is designed for applications requiring relatively high current requirements. Consequently, the Z-axis adhesive used in the present invention has contact resistance of under 1 ohm. However, Z-axis adhesives having higher contact resistance may be used at the expense of causing more electrical noise on the read/write signal.

FIGS. 8 and 9 show a cross-section of conductive particles on the connector 18 before and after bonding.

The term Z-axis adhesive refers to the use of conductive particles 65 dilutely mixed in a thermoplastic or thermosetting film 66, backed up by a conductive lead 64, on a flexible film of structural plastic 61. When heat is applied through this material, the adhesive film 66 is softened and squeezes out from the junction until the conductive particles 65 are in firm, permanent contact with conductors on either side of the adhesive film. These particles 65 conduct electricity and complete the connection between the conductor in the film connector and the conductor on the device which is being attached to the connector. The 'z axis' refers to the phenomenon that electricity can only flow through the adhesive film thickness and substantially not laterally within the film, thereby avoiding shorting-out the conductor pads. Electricity only flows through the thermoplastic film thickness, because the particles 65 are dilutely mixed in the thermoplastic or thermoset film 66, they are individually too small to "bridge" between two pads for which no connection is desired, and there are not enough particles present to clump together and short out adjacent conductors. The down side of using the dilute mixture is that the there are only a few particles available to make the desired connection of two leads together, so there is somewhat more contact resistance than there would be if the adhesive were heavily loaded with particles 65.

The adhesive layer 66 (see FIG. 8) on the flexible substrate 61 with one or more conductive leads 64 may be a thermoplastic layer or a thermoset layer. A thermoplastic adhesive layer 66 becomes soft or liquid upon heating. This type of adhesive is convenient for use when rework of the attachment may be necessary because the components held together by the thermoplastic adhesive may be detached by simply applying heat to the thermoplastic adhesive. However, over a period of time, a thermoplastic adhesive may allow the joint to relax.

A thermoset adhesive layer 66 (see FIG. 8) cures upon heating and then becomes solid and insoluble. This type of adhesive is more stable under extreme temperature, but reworking a joint which is attached with a thermoset adhesive is difficult. The adhesive must be peeled off.

Also, rather than having the adhesive film layer 66 integral with the flexible substrate layer 61, the adhesive film layer 66 may be separately placed between the slider 14 and the connector cable 18 so that the connector leads 64 are attached to the connector pads 22 of the slider 14.

Furthermore, the Z-axis adhesive effect obtained by using a thermoplastic or thermoset adhesive with conductive particles may be obtained without the use of conductive particles if there is sufficient connection between the pads 22 and the leads 64 to conduct electricity. For this embodiment, the leads 64 and the pads 22 must be in direct contact with the adhesive forming around the contact to hold the structures together.

C. Attachment of Slider to Connection Cable

With reference to FIGS. 4, 6–9, the step 32 of attaching the connector 18 to the slider 14 will be described. The 'Heat Seal Connector To Slider' operation would be fairly complex, depending on the details of the flex cable and suspension design. For a connector intended to be used with a conventional suspension as shown in this patent application, the operation is a bit more complicated than it would need to be if the suspension were custom made for use with the connector cable 18. However, the use of a low cost conventional suspension is very desirable, so we will discuss the more complicated version of the station here.

Figure 7:
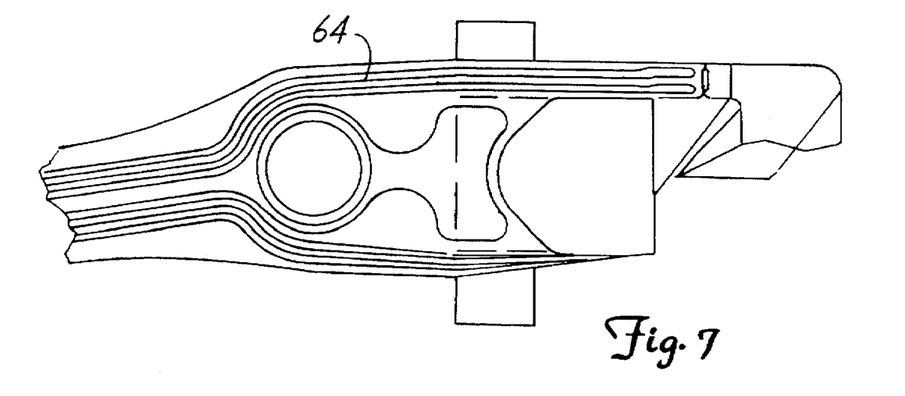
FIG. 7 shows a connector being bonded to a slider.

The basic operations which need to be done by the 'Heat Seal Connector To Slider' station are to place the connector 18 into the correct position for heat sealing, and then to perform the heat seal. As shown in FIG. 7, the cable folding and positioning end effecter gasps the free end of the connector 18 outboard of the slider 14 (away from the suspension), symmetrically folds the connector 18 over a central fixed finger, then pulls both halves of the connector 18 to the center. This places the connector 18 in position for performing the heat seals.

The following describes the process for attaching the leads 64 of the connector cable 18 to the electrical pads 22 of the slider 14 using a thermoplastic adhesive. The two seals needed over the slider electrical pads 22 are very small and in a tightly constrained area (remember that the connector 18 is being held in place by an end effector in almost the same physical location as where the heat seals need to be made) so that these two seals would need to be made by something as compact as the laser heated sealing pads. It should be noted that the electrical connection pads 22 on the rear of the slider 14 have been tailored to match the capabilities and the design of the flex cable connector 18. In other words, the slider electrical pads 22 have been vertically stacked on the rear of slider 14 so that connector leads coming around the side to the end will line up over the electrical pads 22. Once the thermoplastic adhesive 66 on the connector cable 18 is briefly brought up to its 250° F. bonding temperature, the joints will have been made. After a brief cool down period, the heat sealing pads could be withdrawn, and the tool block released from the station. The heat seals establish the joints via the Z-axis adhesive 66 which is on the connector cable 18 in these areas.

When the Z-adhesive 66 used contains a thermoset film, the following technique should be used to attach the connector cable 18 to a slider 14 having a hard bias MR head. Because the MR head (electromagnetic element in the slider) cannot withstand high temperatures for an extended period of time, the initial connection of the connector cable 18 to the connector pads 22 is made by a flash tacking operation. In a flash tacking operation, a pulse of heat (lasting approximately 1 second) at a temperature of around 250° F. to 300° F. is applied to the connector cable lead 64 at the connector pad 22. This flash tacking operation catalyzes the polymerization of the thermoset adhesive. Then the thermoset is cured in a baking operation at a lower temperature around 200° F. This method protects the magnets in the MR head from losing their magnetic properties because of the high temperatures.

It should be noted that for inductive sliders and sliders having a soft bias MR head these two step process need not be implemented for a thermoset adhesive. For inductive sliders and sliders having a soft bias, the thermoset adhesive can be heated at temperatures which will cure the adhesive in a few seconds. For these type of sliders, the thermoset adhesive may be cured at around 300° F.

Although the Z-axis adhesive generally contains conductive particles, the same effect may be obtainable without the use of conductive particles if there is sufficient connection between the pads 22 and the leads 64 to conduct electricity.

D. Connection For Draining Static Charge

One heat seal needs to be made over the top of the slider 14 in roughly the front ⅓ of the slider length. This seal attaches the connector cable 18 to the body of the slider 14. This seal is relatively large and could be done with something like a Hughes soldering station. This connection allows static charge to drain to ground. Furthermore, this connection prevents capacitive coupling of external noise that enters a disk in the hard file and enters the slider body to affect the read back signal. If an application requires this type of attachment to drain static charge, the connection cable 18 must be designed to contain a lead for grounding the slider 14. This attachment will be made if there is such a lead in the connector cable 18.

A preferred alternative for making this attachment would be to use a heated pad having small thermal inertia to perform the seal. This heated pad would be isolated from the rest of the world by a low thermal conductivity support structure, and it would be heated by the use of a short burst from a low powered solid state laser. Such lasers are cheap and reliable and could easily deliver the power level needed to heat the connector adhesive up to its 250° F. bonding temperature.

E. Waste Removal Station

With reference to FIGS. 4 and 6, the fifth step 34 is to remove the waste portion 60 of the connector 18 by grasping that portion and pulling it free. The 'Remove Connector Waste' operation may or may not be needed, depending on how the MR stripe (which is under the read/write element and is connected to the electrical connection pads 22) shorting is provided. During the manufacturing of a hard drive, the MR stripe is shorted to prevent static charge from disabling the MR slider. One method for shorting the MR stripe is to use the leads 64 on the waste section 60 (see FIG. 6) of the connector 18 which span from one electrical connection pad 22 to the other and attach it to the pads 22. This attachment will short the MR stripe, thereby protecting the slider. In this case, the connector waste would be left in place until the actuator was placed in the enclosure that forms the housing for the hard file. However, removing the connector waste when the hard file is almost completely assembled would be very difficult to do because of the forces needed to remove the waste and the weakness of the suspension system at the slider 14. So, in spite of the ESD desirability of shorting the MR slider right at the element, this option would probably not be done.

Figure 12:
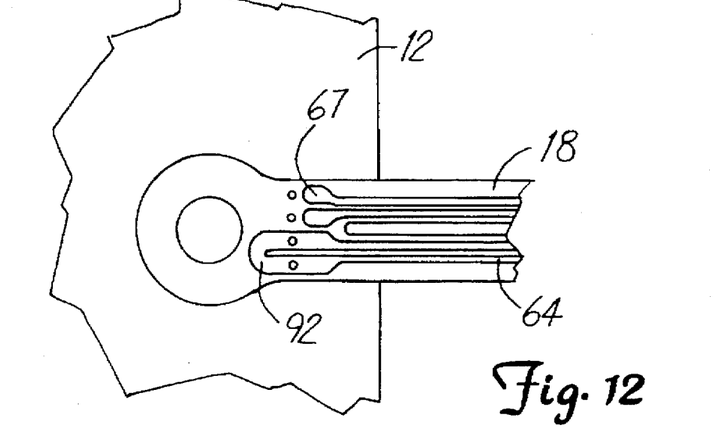
FIG. 12 shows a connector attached to an actuator flex cable.

Rather, the shorting the MR slider at the pads 22 of the slider 14, the present invention provides for this shorting to be provided at the second end 23 of the connector cable 18, which attaches to the actuator flex cable 12. As shown in FIG. 12, the connector cable 12 may be designed to provide a shorting connection between the two MR leads. This shorting connection is shown in FIG. 12 by the loop. This connection lead is looped at the second end 23 of the connector cable with the two conductive leads extending from this loop 92 being connected to an MR lead such that the MR stripe is shorted. This shorting loop 92 may be located on a removable section of the connector cable 18.

Thus, if the shorting loop solution to the ESD problem is used, the connector waste 60 at the slider 14 would be removed on the HGA assembly line. (Note that this operation would not be needed if the connector 18 could go over the top of the slider 14 as it could in the Seagate-style slider with top electrical pads, or as it could if the connector 18 was used to replace the flexure as it was in the IBM Rochester HGA flex cable disclosure). This removal could be a very simple operation involving grasping the connector waste 60, using a small gripper, and pulling the waste section 60 free from the rest of the connector 18. The connector 18 could be weakened on either end by perforations or notches so that the break away would be clean and not weaken the existing heat seals. Since the slider 14 is held solidly in the tool block nest 44, tugging on the connector 18 to remove the waste 60 would not over-stress any part of the HGA 10.

F. Attachment of Suspension to Slider and Connector Cable

Figure 10:
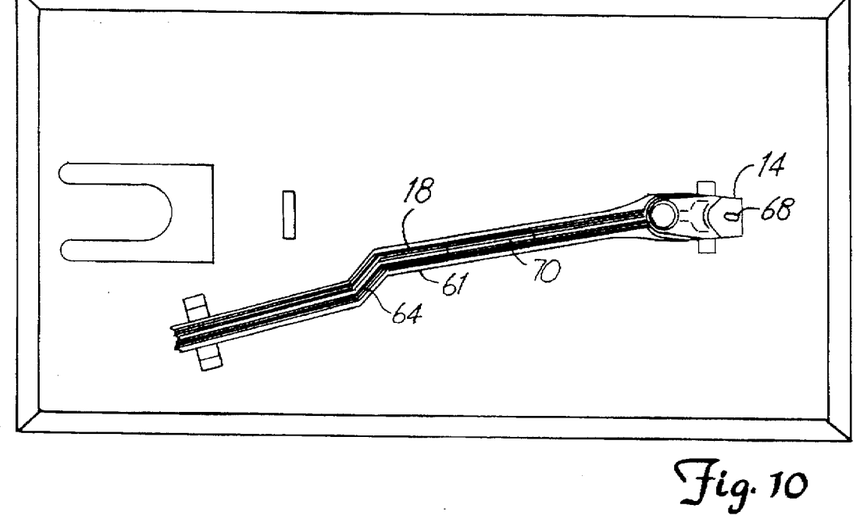
FIG. 10 shows a connector attached to a slider.

Referring to FIGS. 4 and 10, the sixth step is to apply 'instant' adhesive to the slider 14 and to the back of the connector 68. The adhesive is placed at the back of the slider 14 indicated by the number 18, and on the connector 18 at 70. The volume and placement of the spot of adhesive on the back of the slider 14 at 68 needs to be tightly controlled to give a good slider bond strength distribution, and this can be done using vision inspection software coupled with a positive displacement adhesive applicator. The adhesive on the back of the connector 18 for the connector to suspension bond 70 does not have to be controlled tightly, so a second adhesive system could be used to apply that spot without the need for vision inspection, and also to speed up this station.

In the preferred embodiment, the adhesive system used is a cyanoacrylate adhesive (similar to 'Super Glue') modified by the addition of fine black rubber powder. This addition of fine black powder gives the adhesive better tolerance to thermal and mechanical shock than conventional "Super Glue". This adhesive cures rapidly so it is a preferred adhesive for products such as HGAs which need to be fixtured while the adhesive cures.

G. Finishing Steps

Figure 11:
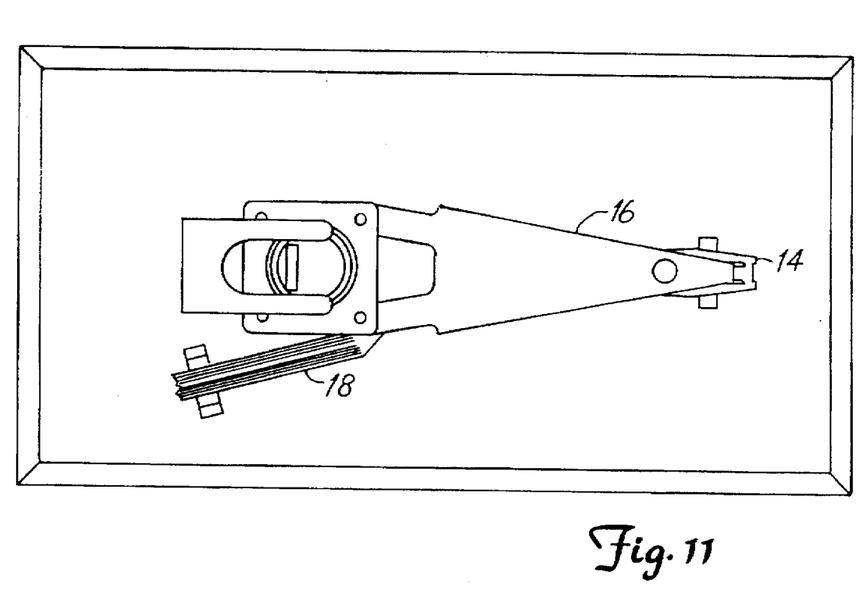
FIG. 11 shows a completed Head Gimbal Assembly on a tool block.

Referring to FIGS. 4, 5, and 11, the seventh step 38 is to pick the suspension 18 out of its incoming tray, and to place it over the suspension locating pin 52, and also over the suspension pull back pin 54. The suspension pull back pin 54 needs to be held open while this is happening, then needs to be released to pull the suspension 16 back and into XY alignment. Finally, a mount block clamp 56 is swung over the mount block 70 to hold it down onto the tool block 42.

Referring to FIG. 4, the eighth step is to allow the tool block 42 with all parts locked in place to circulate for approximately 2½ minutes to develop a nearly full cure of the 'instant' adhesive. This step can be done by just providing enough conveyor length to provide the holdup time.

The ninth and final step is to release the HGA 10 from the toolblock 42, pick it up and place it into an HGA tray ready for eventual cleaning and delivery to an actuator build area where the HGA 10 is connected to a flex actuator cable 12.

The present invention, by using a single sided flexible connector cable 18, eliminates the use of wires on Head Gimbal Assemblies used in magnetic storage drives. It further makes use of a conductive thermoplastic or thermosetting film matrix and anisotropic conductive particles to provide both the mechanical and the electrical connection between the read/write sensor and the connector, and also between the connector and the actuator flex cable assembly. One new feature of this invention is the use of a highly conductive adhesive system to achieve conduction through the adhesive film thickness but not within the plane of the adhesive (a 'z axis' adhesive). This allows for a much simpler assembly process than the prior wire stringing process, giving a low manufacturing tooling cost and a consequent low product cost.

It also provides an opportunity to ground the slider body, and this could be beneficial in reducing ESD damage to the read element of an MR head, and also in reducing noise pickup to MR or conventional inductive thin film heads.

Finally, the use of the cable would allow the creation of a shorting connection between both sides of the MR element, and this shorting connection could be removed simply at actuator level once the risk of ESD damage has been eliminated (as, for example, by connecting the actuator flex cable assembly to the file circuit board). Attaching HGA to Actuator Flex Cable With reference to FIGS. 12–14, the attachment of the HGA 10 to an actuator flex cable 12 and the assembly of a Head Stack Assembly will be described. Before describing the Head Stack Assembly, with reference to FIGS. 12 and 14, the attachment of a connector cable 18 to an actuator flex cable 12 using a Z-axis adhesive 66 will be described.

Figure 14:
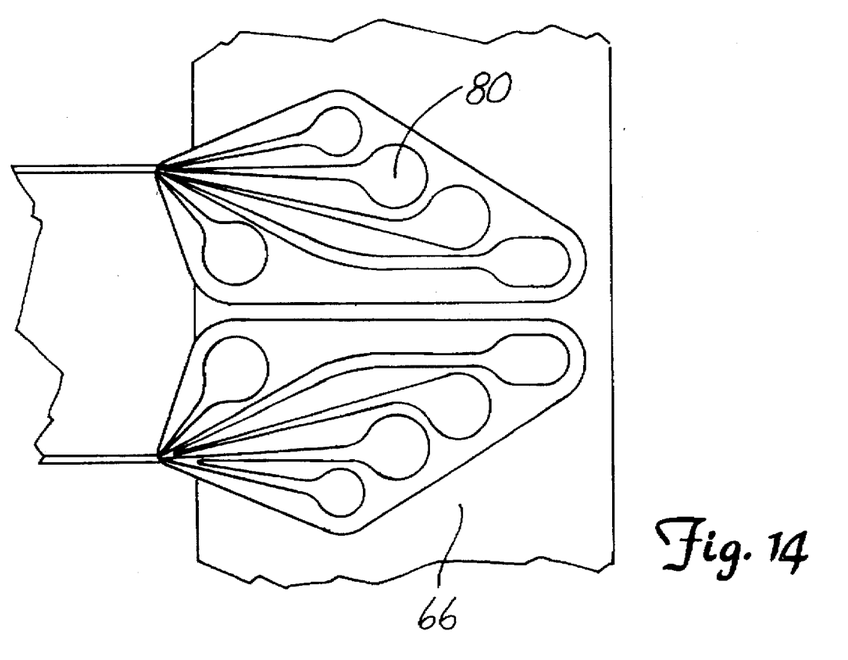
FIG. 14 shows connections pads for an actuator flex cable with a layer of Z-axis adhesive film on top of the connection pads.

The thermoplastic or thermosetting adhesive with the conductive particles may also be used to attach the HGA 10 to an actuator flex cable 12. Most of the drawings do not show the rear-most portion of the connector 18 because this portion of the connector 18 would need to be customized for each different actuator design. For completeness, FIG. 12 shows a schematic of one possible implementation of the connector 18 to flex cable 12 connection. As shown in FIG. 12, the actuator flex cable 12 may be attached to the connector 18 by using a Z-axis adhesive. As clearly shown in FIG. 12, the leads 64 of the connector cable 18 are terminated with pads 67. Furthermore, FIG. 14 shows actuator flex cable connection pads 80, which extend from an actuator flex cable 12. The Z-axis adhesive 66 would be layered between the pads 67 of the connector cable 18 and the pads 80 of the actuator flex cable 12. Heat is them applied to pads and the adhesive, thereby, forming the joint. Because the concerns regarding the MR head is not present at the actuator flex cable 12, heat can be applied to both the thermoplastic or thermoset adhesive until the thermoplastic adhesive has melted and cooled to form the joint or the thermoset adhesive film has cured to form the joint. Once the joint is formed, the actuator flex cable 12 is electrically and mechanically connected to the connector cable 18 through the Z-axis adhesive.

Figure 13:
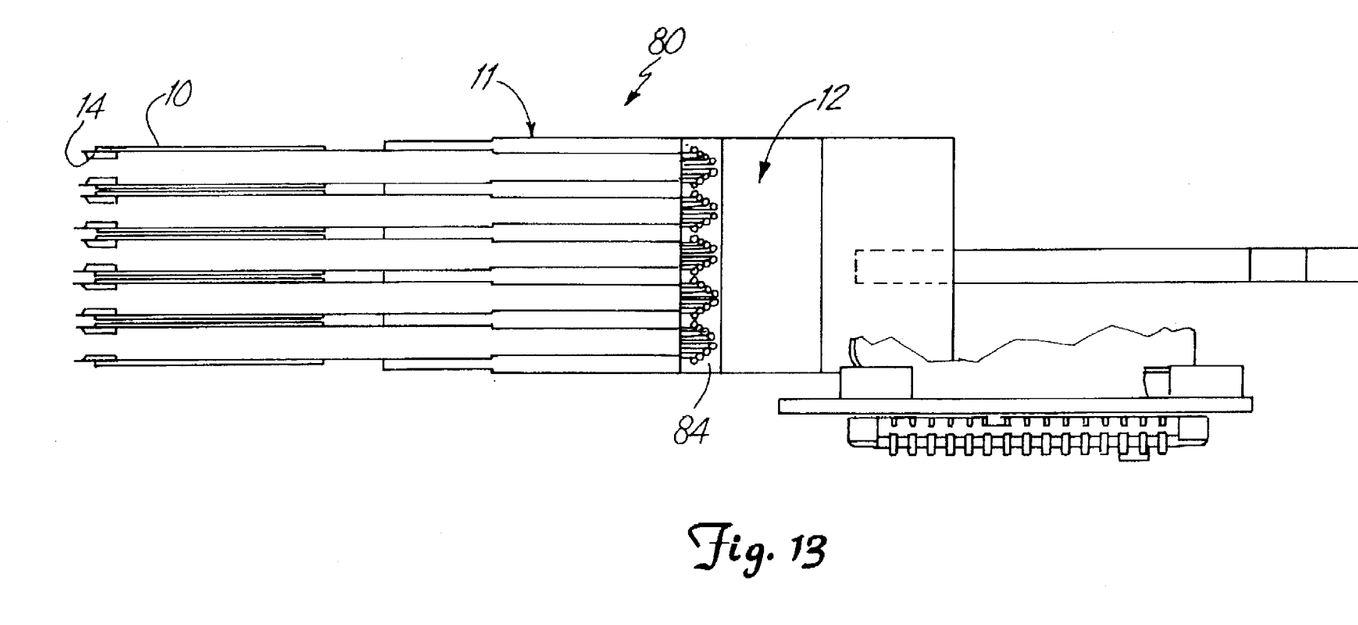
FIG. 13 shows a shows a side view of a Head Stack Assembly.

With reference to FIG. 13, the Head Stack Assembly 82 will be described. A Head Stack Assembly 82 is formed by a plurality of HGAs 10 connected to a comb or e-block 11. As described above, the connector cables 18 from each of the plurality of HGAs 10 is connected to an actuator flex cable 12 containing a plurality of connection pads 80 for connecting the leads 64 of the connector cables 18. Rather than connecting each of the leads individually (which is very labor intensive, time consuming and tedious (thereby prone to assembly error), a Z-axis adhesive 66 is used to attach all of the leads 64 of the connector cables 18 to the flex actuator cables 12.

To attach the connector cable 18 to the actuator flex cable 12, the Z-axis adhesive layer 66 may be integral with the connector cable 18 or the Z-axis adhesive film layer 66 may be separately placed between the connector cable 18 and the actuator flex cable 12.

This invention could provide a significant process simplification to the electrical termination of the head gimbal assembly for magnetic storage drives as well as providing strain relief to the connections, and this translates into a significant actuator level cost reduction. Such a cost reduction opportunity would make such a design extremely attractive to the hyper-competitive hard file industry.

Further, for the MR head which is sensitive to ESD, this invention would provide the ability to temporarily short the MR stripe, and it would also provide a permanent conductive path from the slider to ground. A permanent static ground would be a significant advantage in draining off static charge (created by the rapid motion of sliders through the air within the hard file), as well as eliminating capacitive coupling which can and does bring electrical noise into the read circuit on present generation heads.

Further cost reduction may be achieved with the elimination of the gold pads currently used for wire bonding if a non-oxidizing replacement metal may be found for the gold pads, or if the copper studs which are under the gold plated pads can be used quickly enough and then sealed against further oxidation to provide a reliable long term electrical connection.

While preferred embodiments of the present invention have been described, it should be appreciated that various modifications may be made by those skilled in the art without departing from the spirit and scope of the present invention. Accordingly, reference should be made to the claims to determine the scope of the present invention.

What is claimed is:

1. A head gimbal assembly, comprising:

(a) a slider; and (b) a connector cable attached to the slider assembly using a Z-axis adhesive, whereby electricity is conducted through the adhesive film thickness but not within the plane of the adhesive.

2. The assembly of claim 1, further comprising a suspension attached to the magnetic head assembly and connector.

3. The assembly of claim 1, wherein the Z-axis adhesive is a thermoplastic film containing conductive particles.

4. The assembly of claim 1, wherein the Z-axis adhesive is a thermoset film containing conductive particles.

* * * * *